United States Patent
Li et al.

(10) Patent No.: US 9,064,589 B2
(45) Date of Patent: Jun. 23, 2015

(54) THREE PORT MTJ STRUCTURE AND INTEGRATION

(75) Inventors: Xia Li, San Diego, CA (US); Xiaochun Zhu, San Diego, CA (US); Seung H. Kang, San Diego, CA (US); Jung Pill Kim, San Diego, CA (US); Wah Nam Hsu, San Diego, CA (US); Taehyun Kim, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 283 days.

(21) Appl. No.: 13/356,720

(22) Filed: Jan. 24, 2012

(65) Prior Publication Data

US 2013/0114336 A1  May 9, 2013

Related U.S. Application Data

(60) Provisional application No. 61/557,862, filed on Nov. 9, 2011.

(51) Int. Cl.
*G11C 11/14* (2006.01)
*G11C 11/16* (2006.01)
*G11C 8/16* (2006.01)
*H01L 43/08* (2006.01)
*H01L 27/22* (2006.01)

(52) U.S. Cl.
CPC .......... *G11C 11/161* (2013.01); *G11C 8/16* (2013.01); *G11C 11/16* (2013.01); *H01L 43/08* (2013.01); *H01L 27/228* (2013.01)

(58) Field of Classification Search
USPC ....................................................... 365/171
See application file for complete search history.

(56) References Cited

U.S. PATENT DOCUMENTS

| | | | | |
|---|---|---|---|---|
| 2004/0188732 A1* | 9/2004 | Fukuzumi | ............. | 257/295 |
| 2005/0207216 A1* | 9/2005 | Fukuzumi et al. | ............ | 365/158 |
| 2009/0141540 A1* | 6/2009 | Miura et al. | ............. | 365/158 |
| 2009/0268351 A1* | 10/2009 | Zeltser | ............. | 360/324.2 |
| 2010/0032778 A1* | 2/2010 | Lu et al. | ............. | 257/421 |
| 2010/0142264 A1* | 6/2010 | Numata et al. | ............. | 365/171 |

(Continued)

FOREIGN PATENT DOCUMENTS

EP          1953740 A2    8/2008

OTHER PUBLICATIONS

International Search Report and Written Opinion—PCT/US2012/064536—ISA/EPO—Aug. 12, 2013.

(Continued)

*Primary Examiner* — Huan Hoang
*Assistant Examiner* — Pablo Huerta
(74) *Attorney, Agent, or Firm* — Sam Talpalatsky; Nicholas J. Pauley; Joseph Agusta

(57) ABSTRACT

A two-transistor one-MTJ (2T1MTJ) three port structure includes two separate pin layer structures coupled to one free layer structure. The pin layer structures may include an anti-ferromagnetic layer (AFM) layer coupled to a pin layer. The free layer structure includes free layer coupled to a barrier layer and a cap layer. The free layer structure may include a thin barrier layer coupled to each of the pin layer stacks. The three port MTJ structure provides separate write and read paths which improve read sensing margin without increasing write voltage or current. The three port MTJ structure may be fabricated with a simple two step MTJ etch process.

23 Claims, 15 Drawing Sheets

(56) References Cited

U.S. PATENT DOCUMENTS

| | | | |
|---|---|---|---|
| 2011/0096593 A1* | 4/2011 | Ranjan et al. | 365/158 |
| 2011/0103143 A1* | 5/2011 | Ranjan et al. | 365/171 |
| 2011/0227179 A1* | 9/2011 | Kitagawa et al. | 257/421 |
| 2011/0233696 A1* | 9/2011 | Li | 257/421 |
| 2012/0106233 A1* | 5/2012 | Katti | 365/145 |
| 2012/0158349 A1* | 6/2012 | Lee et al. | 702/130 |
| 2012/0244641 A1* | 9/2012 | Tomioka | 438/3 |
| 2012/0299133 A1* | 11/2012 | Son et al. | 257/421 |
| 2013/0182501 A1* | 7/2013 | Sakimura et al. | 365/158 |
| 2013/0187247 A1* | 7/2013 | Wu et al. | 257/421 |
| 2013/0201757 A1* | 8/2013 | Li et al. | 365/171 |
| 2013/0223141 A1* | 8/2013 | Ranjan et al. | 365/158 |
| 2014/0015080 A1* | 1/2014 | Kang et al. | 257/421 |

OTHER PUBLICATIONS

Braganca P.M., et al., "A Three-Terminal Approach to Developing Spin-Torque Written Magnetic Random Access Memory Cells," IEEE Transactions on Nanotechnology, Mar. 2009, Vol. 8, No. 2, pp. 190-195.

* cited by examiner

THREE PORT MTJ STRUCTURE AND INTEGRATION

CROSS REFERENCE TO RELATED APPLICATION

The present application claims the benefit of U.S. Provisional Patent Application No. 61/557,862 to Li et al. filed Nov. 9, 2011.

TECHNICAL FIELD

The present disclosure generally relates to magnetic tunnel junction (MTJ) devices. More specifically, the present disclosure relates to three port MTJ structures with improved read margins.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). An MTJ normally also includes top and bottom electrode and may be formed with or without an antiferromagnetic layer to pin the fixed layer. The electrical resistance of an MTJ depends on whether the free layer magnetization and fixed layer magnetization are parallel or anti-parallel with each other. A memory device such as Spin-Transfer Torque (STT) MRAM is built from an array of individually addressable MTJs.

To write data in STT MRAM, a write current with a specific direction of write "1" or "0", which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In STT MRAM, two distinct states are defined by two different resistances of an MTJ in a bitcell of the MRAM. The two different resistances represent a logic "0" and a logic "1" value stored by the MTJ.

SUMMARY

Aspects of the present disclosure include a three port magnetic tunnel junction (MTJ) including a free layer and at least one barrier layer coupled to the free layer. According to an aspect of the disclosure, a first barrier layer is coupled to the first pin layer, and a thicker second barrier layer is coupled to the second pin layer.

Aspects of the present disclosure also include a method of constructing a three port magnetic tunnel junction (MTJ). The method includes depositing a free layer, depositing at least one barrier layer coupled to the free layer, depositing a first pin layer coupled to the barrier layer, and depositing a second separate pin layer coupled to the barrier layer. According to an aspect of the disclosure, the method also includes depositing a first barrier layer onto the free layer, depositing a second barrier layer onto the first barrier layer to provide a thick barrier layer between the second pin layer and the free layer; and etching a portion of the second barrier layer to provide a thin barrier layer between the first pin layer and the free layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Aspects of the present disclosure include a two-transistor one-MTJ (2T1MTJ) three port structure. The three port MTJ structure include two separate pin layer structures coupled to one free layer structure. In in-plane MTJs, each of the pin layer structures may include an anti-ferromagnetic layer (AFM) layer coupled to a pin layer. In perpendicular MTJs, the pin layer structure may not include the AFM layer. The free layer structure includes a free layer coupled to a barrier layer and a cap layer. The free layer structure may include a thin barrier layer coupled to each of the pin layer stacks. Alternatively, the free layer structure may include a thick barrier layer portion coupled to a first one of the pin layer stacks and a thicker barrier layer portion coupled to a second one of the pin layer stacks. The three port MTJ structure provides separate write and read paths that improve read sensing margin without increasing write voltage or current. The three port MTJ structure may be fabricated with a two step MTJ etch process.

Aspects of the present disclosure provide MTJ structures with a large resistance level gap (ΔR) between high and low resistance states. This gap allows for easy voltage sensing with reduced disturbance of stored data by read currents. Write currents are applied on paths through the MTJ structures that are different from the read current paths. The write path still has low write voltage or current without increased overhead voltage or current.

According to aspects of the disclosure, the MTJ structure can have one or two write paths. The write path(s) include a thin barrier layer. Electrical resistance times area (RA) in the write path(s) is small and switching voltage (i.e., the voltage level to switch states of the MTJ) or current is small.

According to aspects of the disclosure, the MTJ structure can have one or two read paths. The read paths include a thick barrier layer or double barrier layer. Electrical resistance times area (RA) in the read path(s) is large and ΔR is large to provide easy sensing.

Figure 1A:
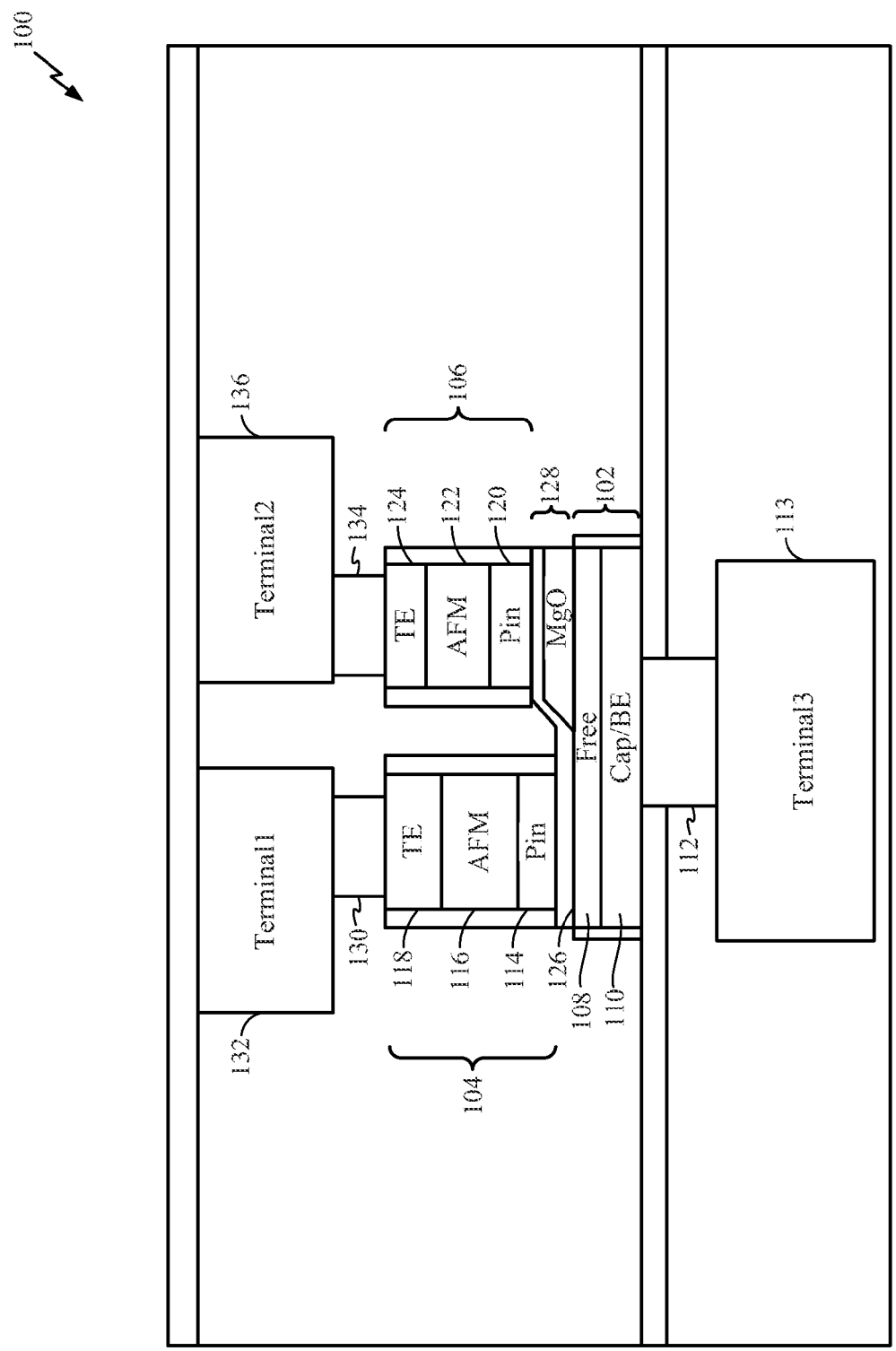
FIGS. 1A-1B are cross-sectional diagrams of a three-port magnetic tunnel junction (MTJ) structure according to aspects of the present disclosure.

FIG. 1A is a cross-sectional diagram of an arrangement of layers of a representative three port magnetic tunnel junction (MTJ) structure 100 according to an aspect of the disclosure. The three port MTJ structure 100 includes a free layer structure 102 coupled to two pin layer structures 104, 106. The free layer structure 102 includes a free layer 108 and a cap layer 110 coupled to a bottom contact 112.

A first pin layer structure 104 includes a first pin layer 114 coupled to a first anti-ferromagnetic (AFM) layer 116. The first AFM layer 116 is coupled to a first top electrode layer 118. A second pin layer structure 106 includes a second pin layer 120 coupled to a second AFM layer 122. The second AFM layer 122 is coupled to a second top electrode layer 124. A two step etch process may be used to separate the first pin layer 114 from the second pin layer 120. A single barrier layer 126 is coupled between the free layer 108 and the first pin layer 114. A double barrier layer 128 is coupled between the free layer 108 and the second pin layer 120.

A first top contact 130 is coupled between the first top electrode 118 and a first terminal 132 of the three port MTJ structure 100. A second top contact 134 is coupled between the second top electrode 124 and a second terminal 136 of the three port MTJ structure 100. The bottom contact 112 is coupled to a third terminal 113 of the three port MTJ structure 100.

According to one aspect of the present disclosure, a process of fabricating the three port MTJ 100 includes depositing two barrier layers, for example two MgO layers on the free layer 108. A portion of one of the MgO layers is etched away leaving a single MgO layer which forms the thin barrier layer 126. The MgO layer may be etched without damaging the free layer 108. The portion of the two MgO layers not etched forms the double barrier layer 128. A two step etch process may separate the first pin layer 114 from the second pin layer 120.

Figure 1B:
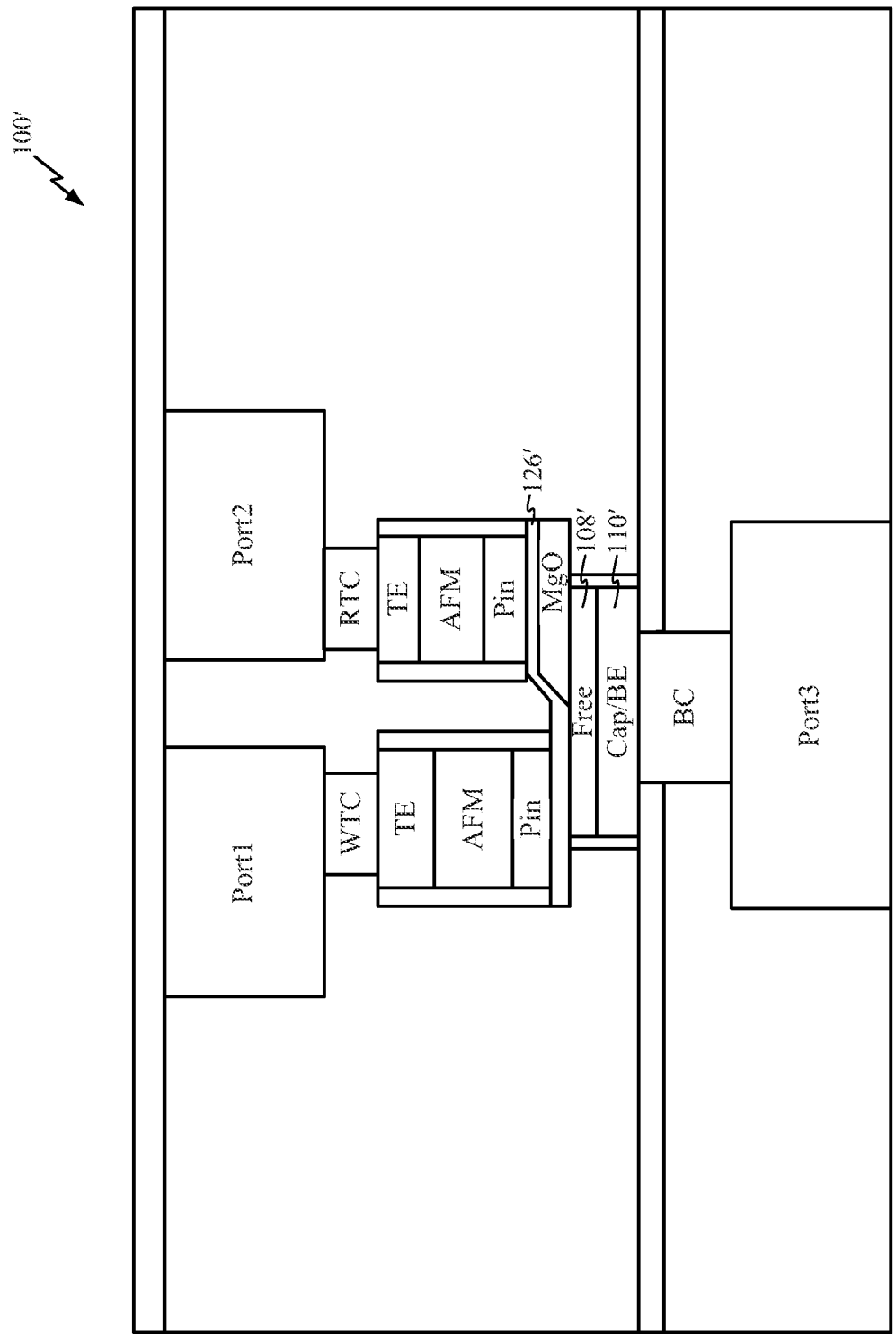

Although FIG. 1A shows free layer 108 and cap layer 110 extending substantially the same length as the single barrier layer 126, alternate configurations are also contemplated. For example, as seen in FIG. 1B the free layer 108' and cap layer 110' can be smaller than the single barrier layer 126' to help reduce write current.

Figure 2A:
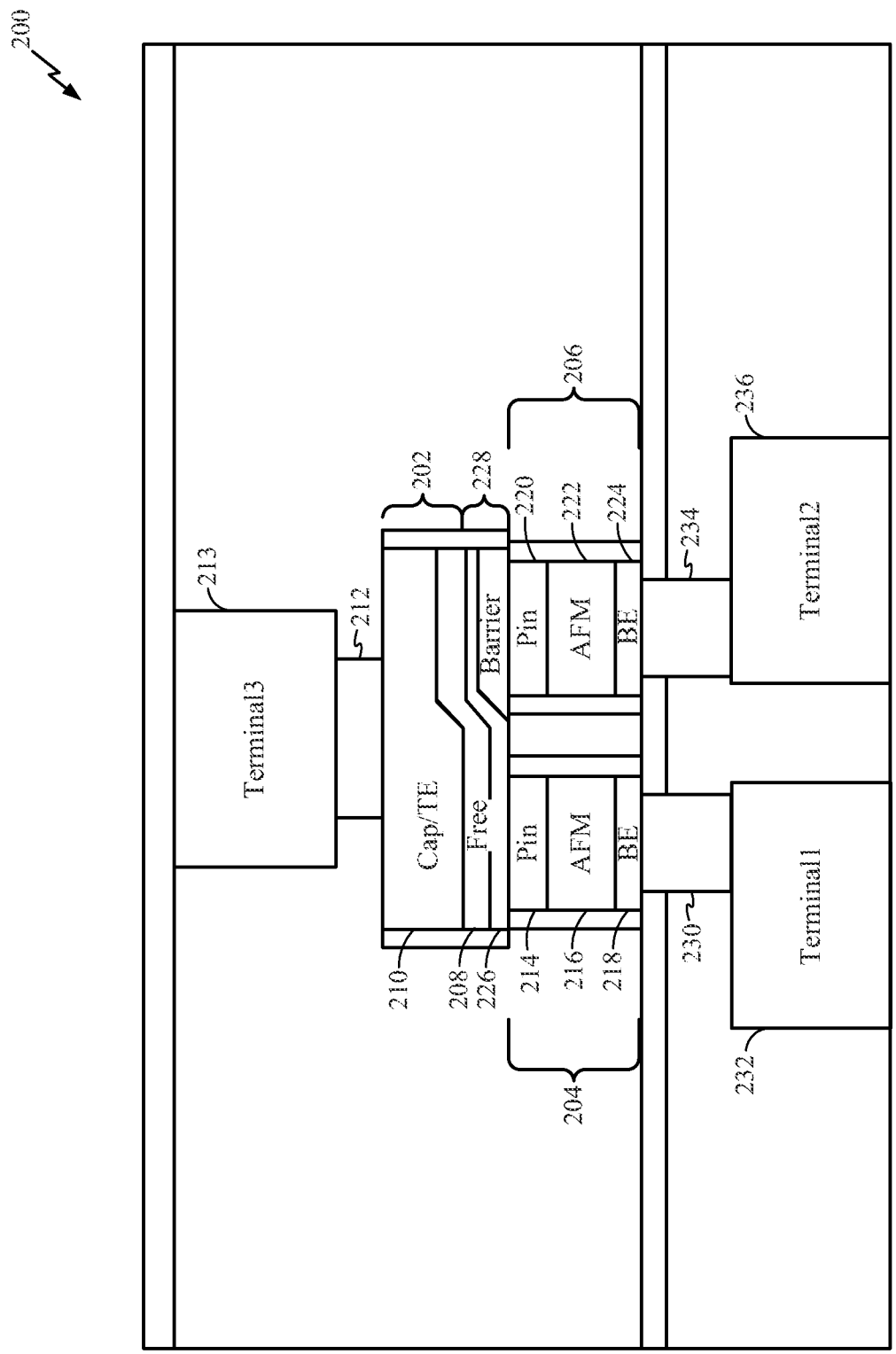
FIGS. 2A-2B are cross-sectional diagrams of a three-port magnetic tunnel junction (MTJ) structure according to aspects of the present disclosure.

FIG. 2A is a cross-sectional diagram of an arrangement of layers of in another representative three port magnetic tunnel junction (MTJ) structure 200 according to an aspect of the disclosure. The three port MTJ structure 200 includes a free layer structure 202 coupled to two pin layer structures 204, 206. The free layer structure 202 includes a free layer 208 and a cap layer 210 coupled to a top contact 212. A first pin layer structure 204 includes a first pin layer 214 coupled to a first anti-ferromagnetic (AFM) layer 216. The first AFM layer 216 is coupled to a first bottom electrode layer 218. A second pin layer structure 206 includes a second pin layer 220 coupled to a second AFM layer 222. The second AFM layer 222 is coupled to a second bottom electrode layer 224. A single barrier layer 226 is coupled between the free layer 208 and the first pin layer 214. A two step etch process may separate the first pin layer 214 from the second pin layer 220. A double barrier layer 228 is coupled between the free layer 208 and the second pin layer 220.

A first bottom contact 230 is coupled between the first bottom electrode 218 and a first terminal 232 of the three port MTJ structure 200. A second bottom contact 234 is coupled between the second bottom electrode 224 and a second terminal 236 of the three port MTJ structure 200. The top contact 212 is coupled to a third terminal 213 of the three port MTJ structure 200.

The three port MTJ structure 200 is similar to the three port MTJ structure 100 shown in FIG. 1A, except for having layers formed in reverse order. According to one aspect of the present disclosure, a process of fabricating the three port MTJ 200 includes planarizing the first pin layer 214 and the second pin layer 220 then depositing two barrier layers, for example two MgO layers on the planarized first pin layer 214 and second pin layer 220. A portion of one of the MgO layers is etched away leaving a single MgO layer that forms the thin barrier layer 226 over the first pin layer 214. The remaining portion of the two MgO layers forms the double barrier layer 228 over the second pin layer 220. The MgO layer may be etched before the free layer 208 is deposited and therefore does not damage the free layer 208. A two step etch process may to separate the first pin layer 214 from the second pin layer 220. A plasma treatment process may round a step in the MgO layer that results from the etching process.

Figure 2B:
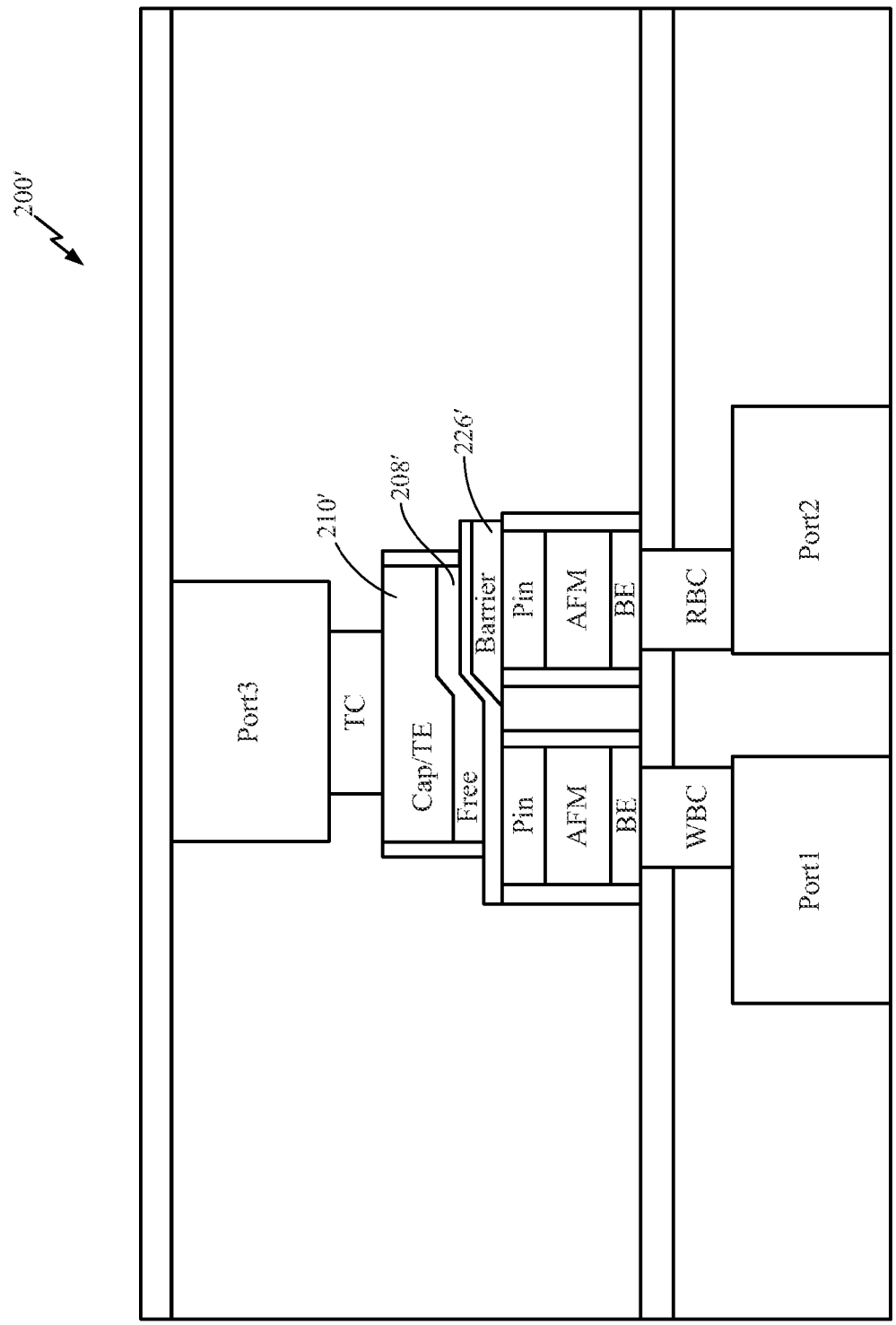

Although FIG. 2A shows free layer 208 and cap layer 210 extending substantially the same length as the single barrier layer 226, alternate configurations are also contemplated. For example, as seen in FIG. 2B the free layer 208' and cap layer 210' can be smaller than the single barrier layer 226' to help reduce write current.

The three terminal MTJ structures 100, 200 shown in FIGS. 1A, 1B, 2A and 2B, each provide separate paths for writing data to the MTJ and reading data from the MTJ. A write path extends through the first pin layer structure of the MTJ. The first pin layer structure includes only a thin barrier layer, which exhibits a relatively small RA. This allows writing data to the MTJ with a relatively small switching voltage or current.

A read operation may be performed by sensing one of two read paths that extend through the second pin layer structure of the MTJ. A first one of the two read paths extends between a first terminal and the second terminal. A second one of the two read paths extends between the second terminal and the third terminal of the MTJ. The second pin layer structure includes a thick barrier layer or double barrier layer. Because of its thick barrier layer, the second pin layer structure exhibits a large RA and a large difference (ΔR) between parallel and anti-parallel resistance of the MTJ. The large ΔR may be more than twice the value of ΔR in a two terminal MTJ, for example, and may be more readily sensed during a read operation.

Figure 3:
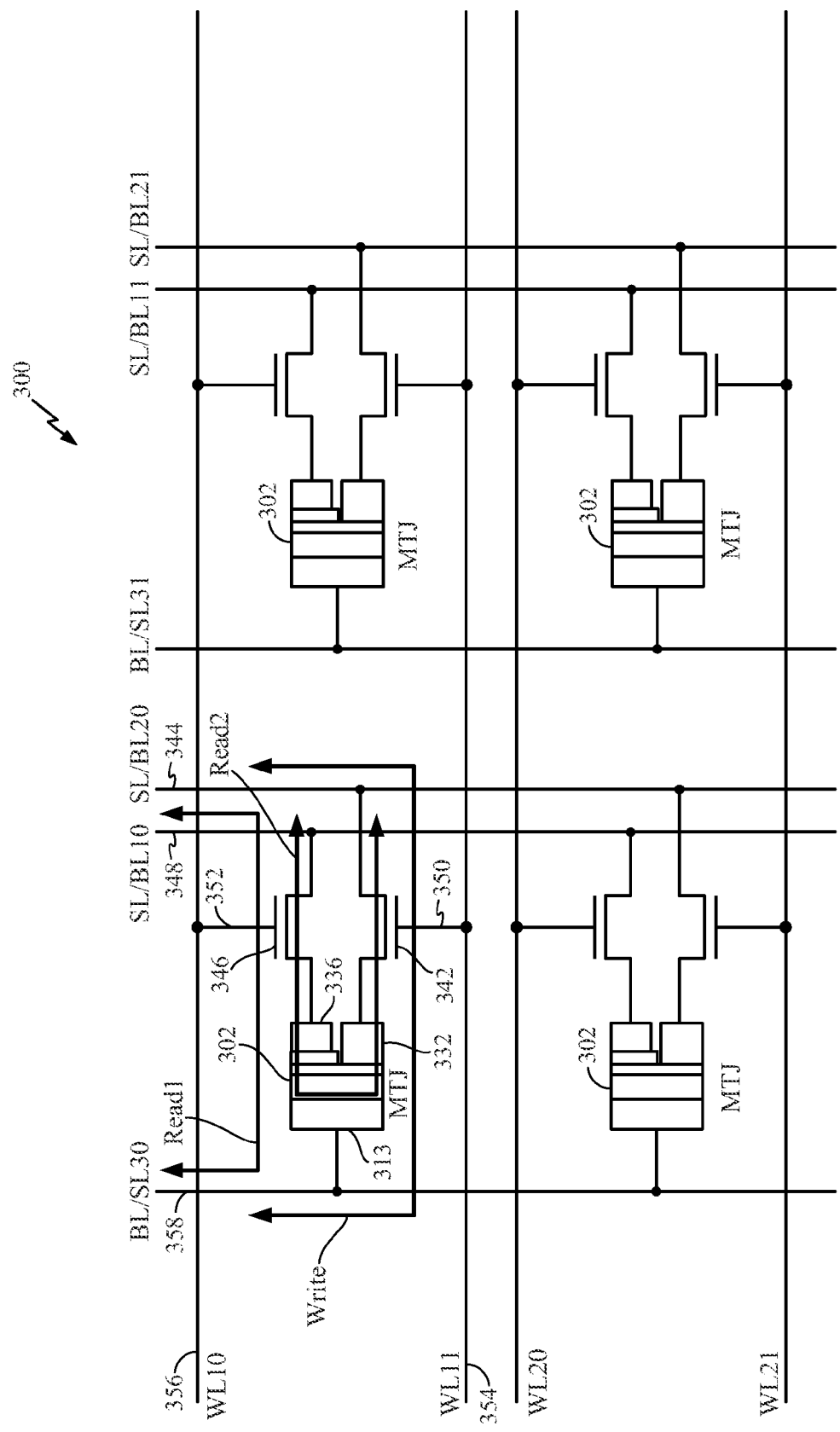
FIG. 3 is a schematic circuit diagram of an array of three-port MTJ (MTJ) structures according to aspects of the present disclosure.

FIG. 3 is a schematic diagram of an array 300 of the three port MTJ structures 302 such as the three port MTJ structures 100, 100' 200 and 200' shown in FIGS. 1A, 1B, 2A and 2B. For each MTJ structure 302 in the array 300, a first transistor 342 is coupled between a first terminal 332 of the MTJ and a first bit line 344. A second transistor 346 is coupled between a second terminal 336 of the MTJ and a second bit line 348. A gate 350 of the first transistor 342 and a gate 352 of the second transistor 346 are coupled to respective word lines 354, 356 of the array 300. A third terminal 313 of each of the MTJ structures 302 is coupled to a corresponding bit line 358 of the array 300. Although the term bit line is used in the preceding description, the illustrated configuration contemplates either source lines (SL) or bit lines (BL), as depicted in FIG. 3 (and FIG. 6, described later).

A read operation may be performed on a first read path by turning on the second transistor 346 and sensing resistance between the bit line 348 and the bit line 358. A read operation may also be performed on a second read path by turning on both the first transistor 342 and the second transistor 346 and then sensing resistance between the bitline 348 and the bitline 344. A write operation may be performed on a first write path by turning on the first transistor 342 and then applying a write current between the bit line 358 and the bit line 344.

According to one aspect of the disclosure, a configuration of three port MTJs includes means for applying write current from a first port, through a free layer, a first barrier layer coupled to the free layer; a first pin layer coupled to the first barrier layer; and a second port. The means for applying write current may include a transistor such as the first transistor 342 and bit lines such as the bit lines 358 and 344, for example. The configuration also includes means for applying read current from a third port, through the free layer, a second barrier layer thicker than the first barrier layer and coupled to the free layer; a second pin layer separate from the first pin layer and coupled to the second barrier layer; and the second port. The means for applying read current may include a transistor such as 346 and bit lines such as 358 and 348, for example.

In one aspect, the aforementioned means may be the word lines 356, 354, bit lines 344, 348, 352, and/or transistors 342, 346 configured to perform the recited functions. In another aspect, the aforementioned means may be any module or any apparatus configured to perform the functions recited by the aforementioned means.

Figure 4A:
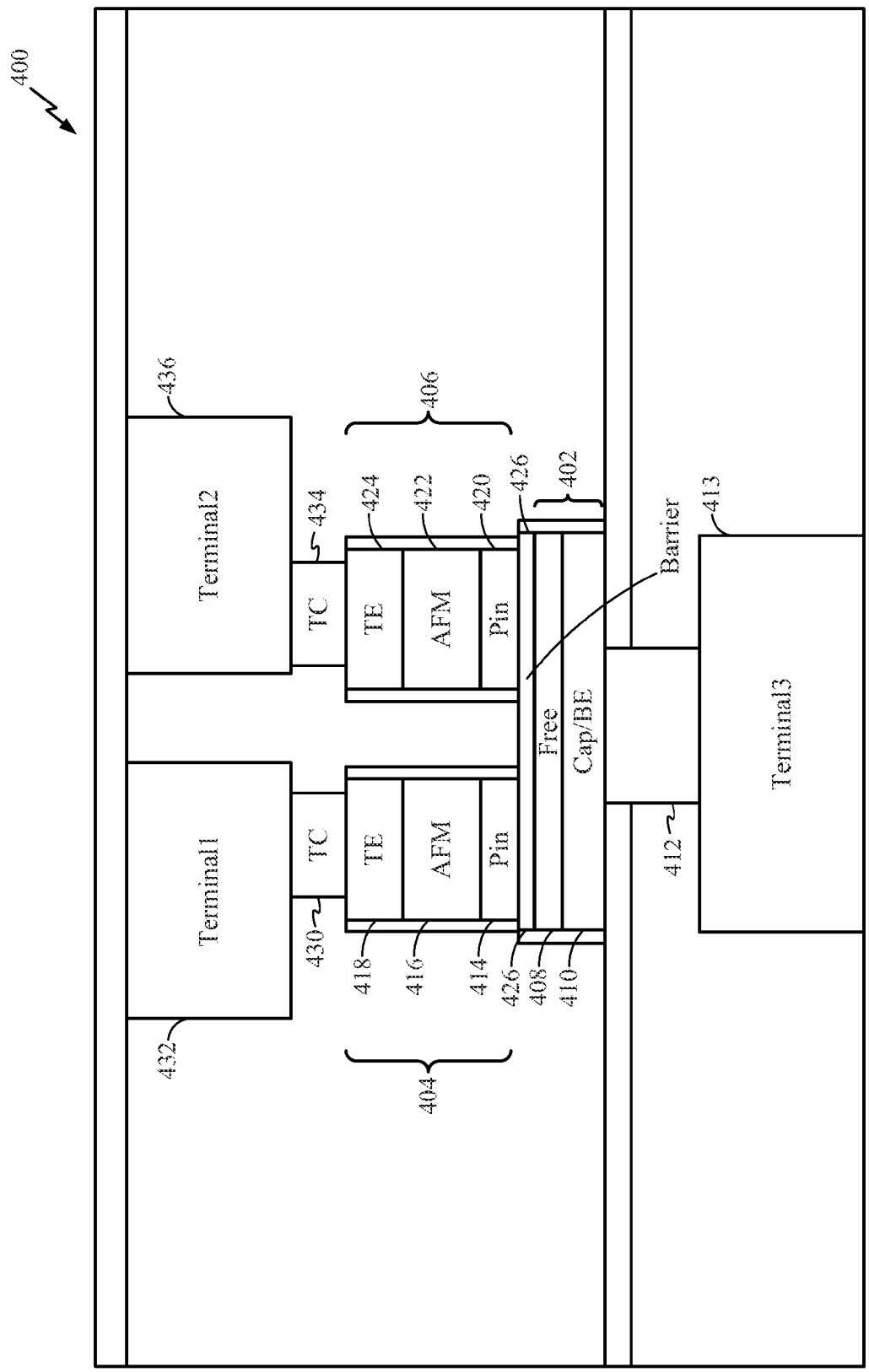
FIGS. 4A-4B are cross-sectional diagrams of a three-port magnetic tunnel junction (MTJ) structure according to aspects of the present disclosure.

FIG. 4A is a cross-sectional diagram of an arrangement of layers of a representative three port magnetic tunnel junction (MTJ) structure 400 according to another aspect of the disclosure. The three port MTJ structure 400 includes a free layer structure 402 coupled to two pin layer structures 404, 406. The free layer structure 402 includes a free layer 408 and a cap layer 410 coupled to a bottom contact 412.

A first pin layer structure 404 includes a first pin layer 414 coupled to a first anti-ferromagnetic (AFM) layer 416. The first AFM layer 416 is coupled to a first top electrode layer 418. A second pin layer structure 406 includes a second pin layer 420 coupled to a second AFM layer 422. The second AFM layer 422 is coupled to a second top electrode layer 424. A single barrier layer 426 is coupled between the free layer 408 and the first pin layer 414. The single barrier layer 426 is also coupled between the free layer 408 and the second pin layer 420.

A first top contact 430 is coupled between the first top electrode 418 and a first terminal 432 of the three port MTJ structure 400. A second top contact 434 is coupled between the second top electrode 424 and a second terminal 436 of the three port MTJ structure 400. The bottom contact 412 is coupled to a third terminal 413 of the three port MTJ structure 400.

Figure 4B:
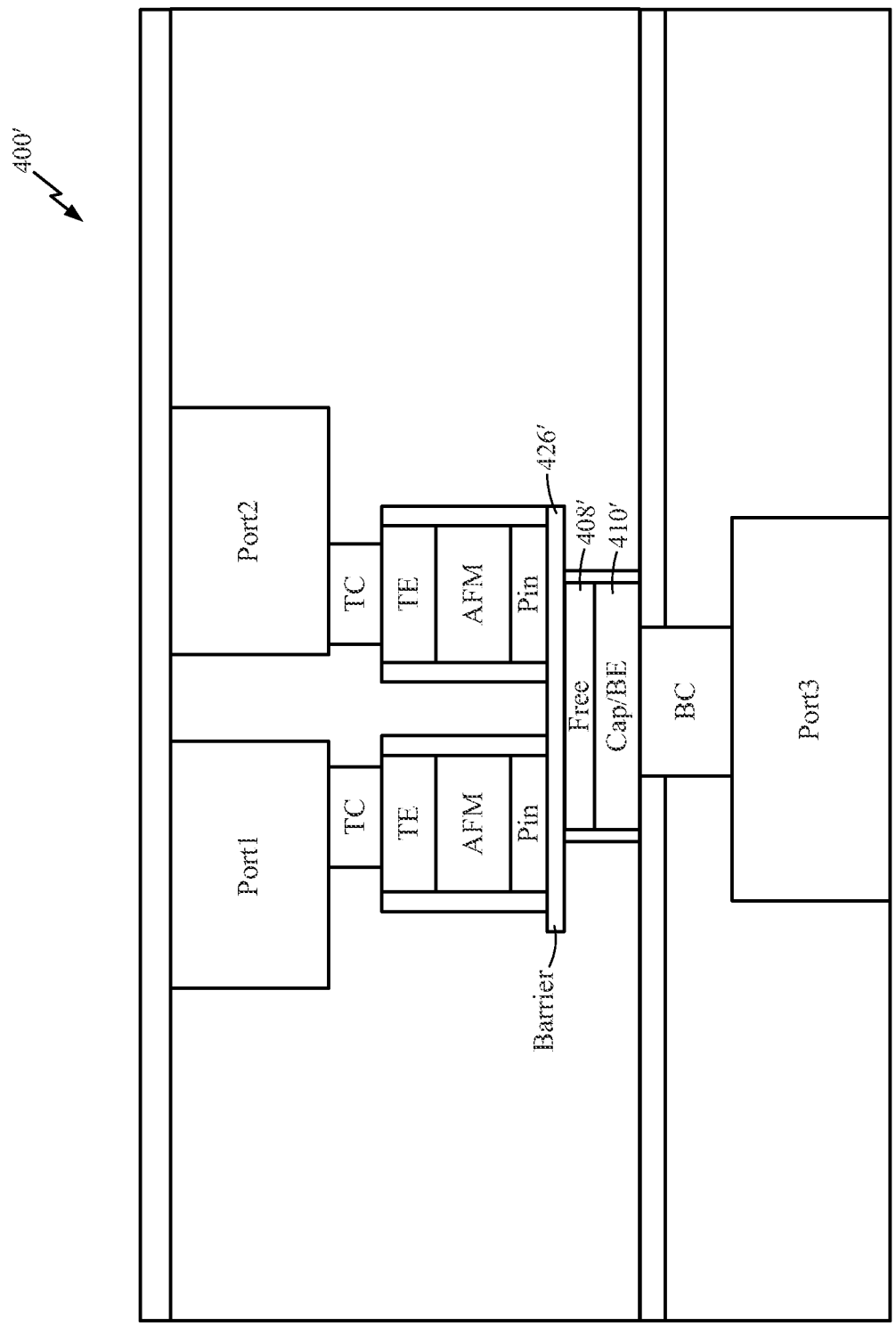

Although FIG. 4A shows free layer 408 and cap layer 410 extending substantially the same length as the single barrier layer 426, alternate configurations are also contemplated. For example, as seen in FIG. 4B the free layer 408' and cap layer 410' can be smaller than the single barrier layer 426' to help reduce write current.

Figure 5A:
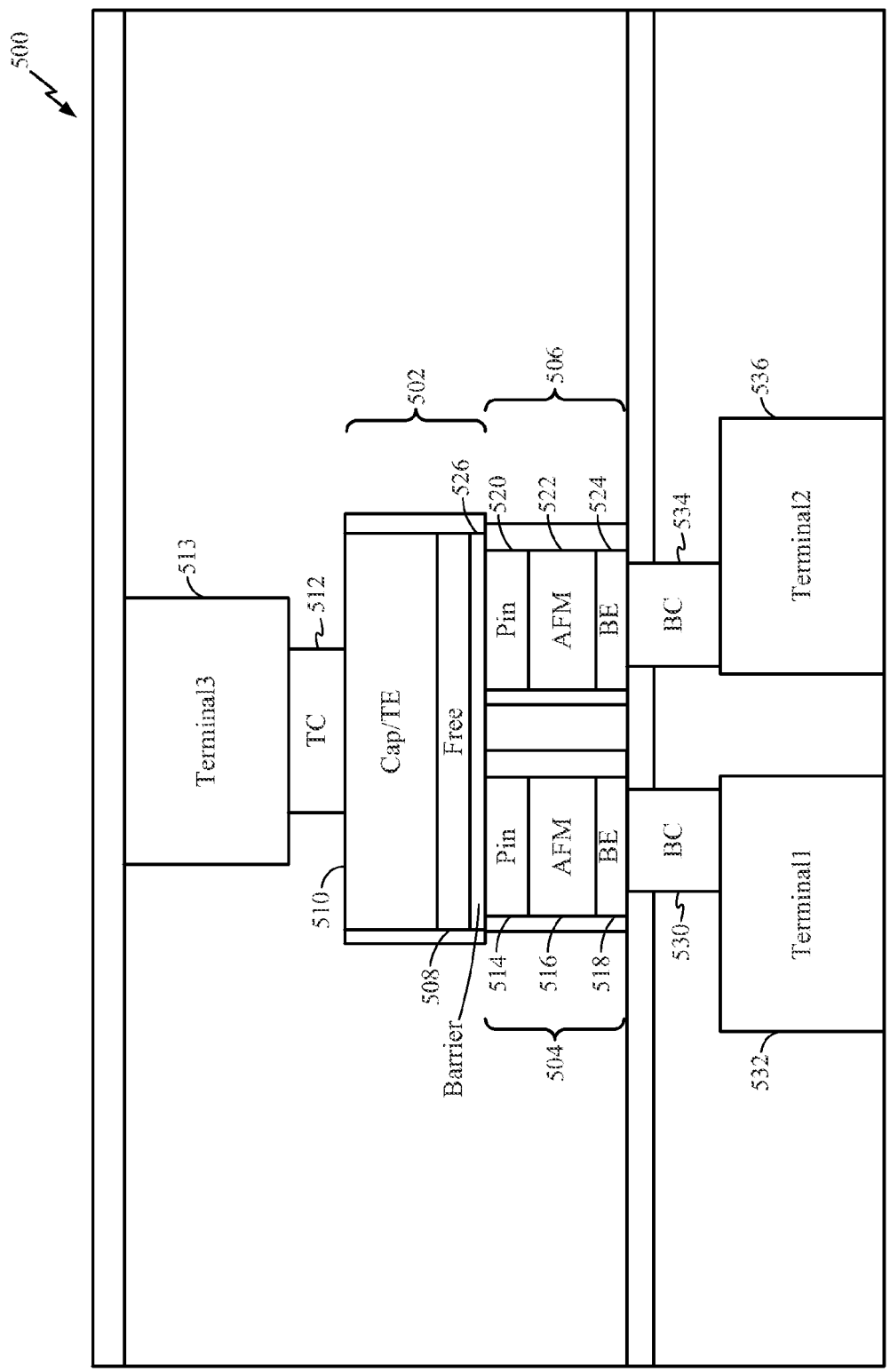
FIGS. 5A-5B are cross-sectional diagrams of a three-port magnetic tunnel junction (MTJ) structure according to aspects of the present disclosure.

FIG. 5A is a cross-sectional diagram of an arrangement of layers of in another representative three port magnetic tunnel junction (MTJ) structure 500 according to an aspect of the disclosure. The three port MTJ structure 500 includes a free layer structure 502 coupled to two pin layer structures 504, 506. The free layer structure 502 includes a free layer 508 and a cap layer 510 coupled to a top contact 512. A first pin layer structure 504 includes a first pin layer 514 coupled to a first anti-ferromagnetic (AFM) layer 516. The first AFM layer 516 is coupled to first bottom electrode layer 518. A second pin layer structure 506 includes a second pin layer 520 coupled to a second AFM layer 522. The second AFM layer 522 is coupled to a second bottom electrode layer 524. A single barrier layer 526 is coupled between the free layer 508 and the first pin layer 514. The single barrier layer 526 is also coupled between the free layer 508 and the second pin layer 520.

A first bottom contact 530 is coupled between the first bottom electrode 518 and a first terminal 532 of the three port MTJ 500. A second bottom contact 534 is coupled between the second bottom electrode 524 and a second terminal 536 of the three port MTJ structure 500. The top contact 512 is coupled to a third terminal 513 of the three port MTJ structure 500.

The three port MTJ structure 500 is similar to the three port MTJ structure 400 shown in FIG. 4A, except for having layers formed in reverse order.

According to one aspect of the present disclosure, a process of fabricating the three port MTJ structure 500 includes planarizing the first pin layer 514 and the second pin layer 520 then depositing the MgO barrier layer 526 on the planarized first pin layer 514 and second pin layer 520.

Figure 5B:
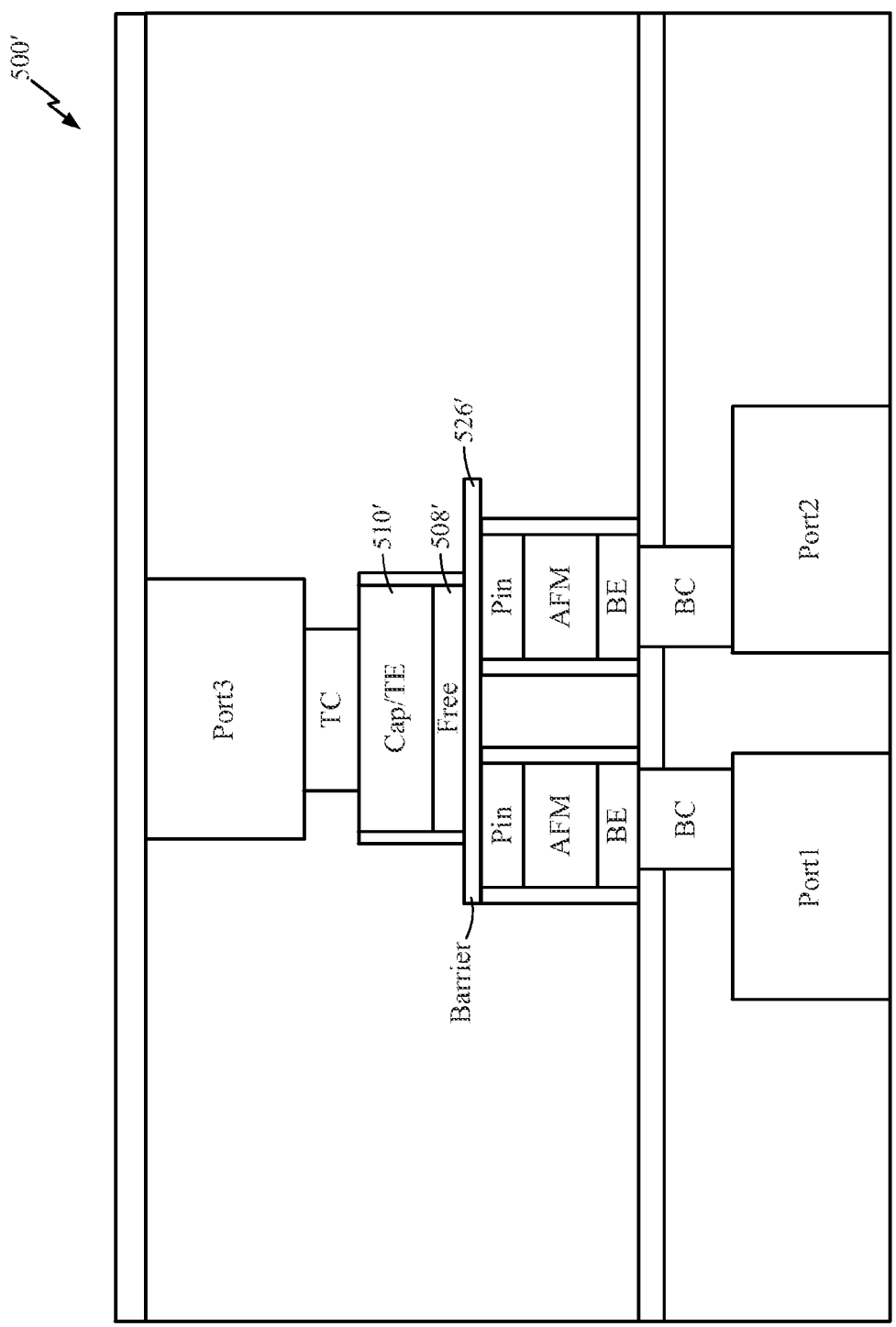

Although FIG. 5A shows a free layer 508 and cap layer 510 extending substantially the same length as the single barrier layer 526, alternate configurations are also contemplated. For example, as seen in FIG. 5B the free layer 508' and cap layer 510' can be smaller than the single barrier layer 526' to help reduce write current.

The three terminal MTJ structures 400, 400' 500 and 500' shown in FIGS. 4A, 4B, 5A and 5B, each provide separate paths for writing data to the MTJ and reading data from MTJ. A first write path extends through the first pin layer structure of the MTJ. A second write path extends through the second pin layer structure of the MTJ. The first pin layer structure and second pin layer structure each include only a thin barrier layer, which exhibits a relatively small RA. This allows writing data to the MTJ by using either the first write path, the second write path or both.

A read operation may be performed by sensing a read path between the first terminal and the second terminal. The read path extends through both the first pin layer structure and the second pin layer structure. Because the read path extends through the barrier layer twice, the read path exhibits a large RA and a large difference (ΔR) between parallel and anti-parallel resistance of the MTJ. The large ΔR may be more than twice the value of ΔR in a two terminal MTJ, for example, and may be more readily sensed during a read operation.

Figure 6:
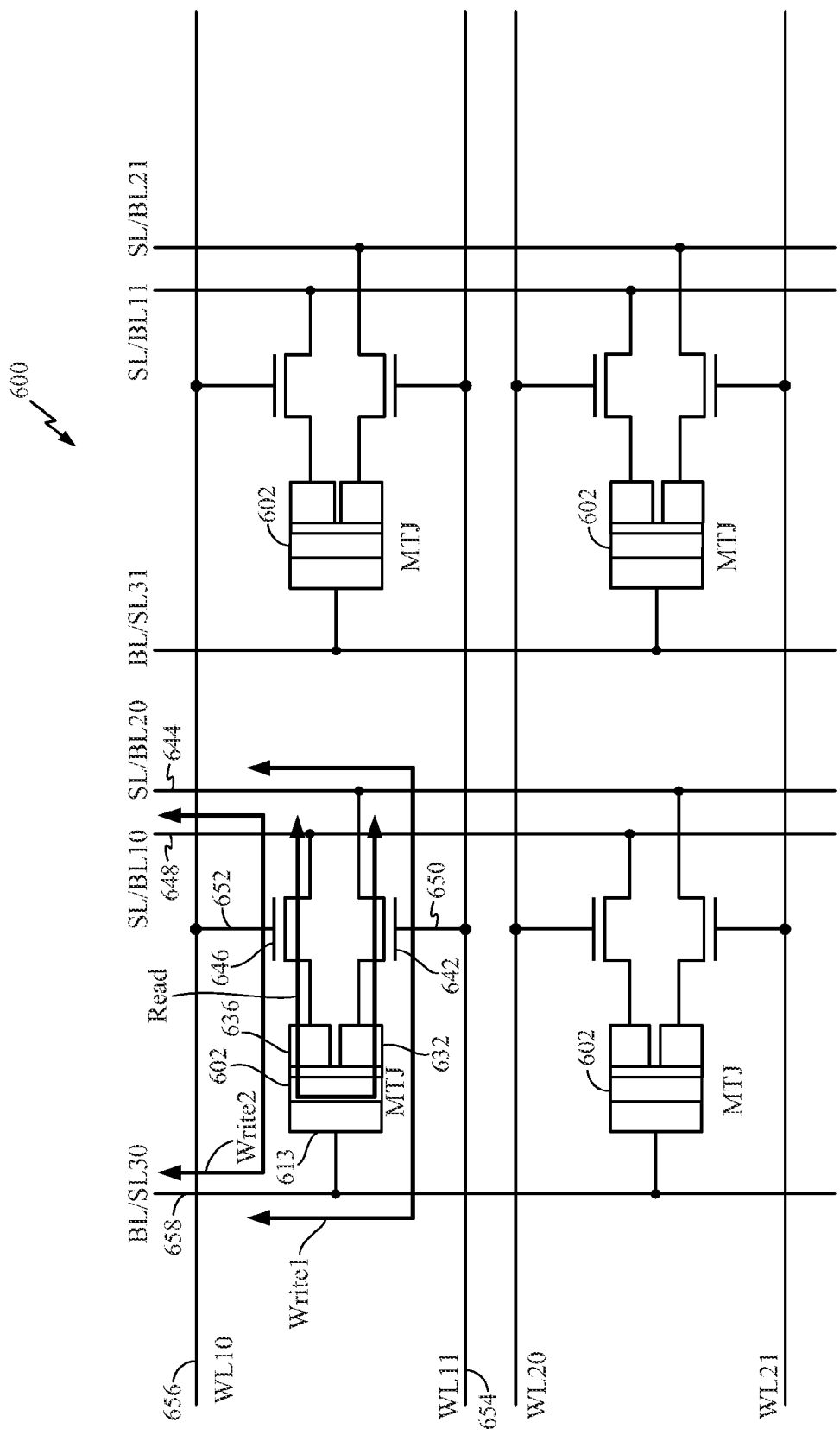
FIG. 6 is a schematic circuit diagram of an array of three-port MTJ (MTJ) structures according to aspects of the present disclosure.

FIG. 6 is a schematic diagram of an array 600 of the three port MTJ structures 602 such as the three port MTJ structures 400, 500 shown in FIGS. 4 and 5. For each MTJ structure 602 in the array 600, a first transistor 642 is coupled between a first terminal 632 of the MTJ and a first bit line 644. A second transistor 646 is coupled between a second terminal 636 of the MTJ and a second bit line 648. A gate 650 of the first transistor 642 and a gate 652 of the second transistor 646 are coupled to respective word lines 654, 656 of the array 600. A third terminal 613 of each of the MTJ structures 602 is coupled to a corresponding bit line 658 of the array 600.

A read operation may be performed on a first read path by turning on both the first transistor 642 and the second transistor 646 and then sensing resistance between the bitline 648 and the bitline 644. A write operation may be performed on a first write path by turning on the first transistor 642 and then applying a write current between the bit line 658 and the bit line 644. A write operation may be performed on a second write path by turning on the second transistor 642 and then applying a write current between the bit line 658 and the bit line 648.

Figure 7A:
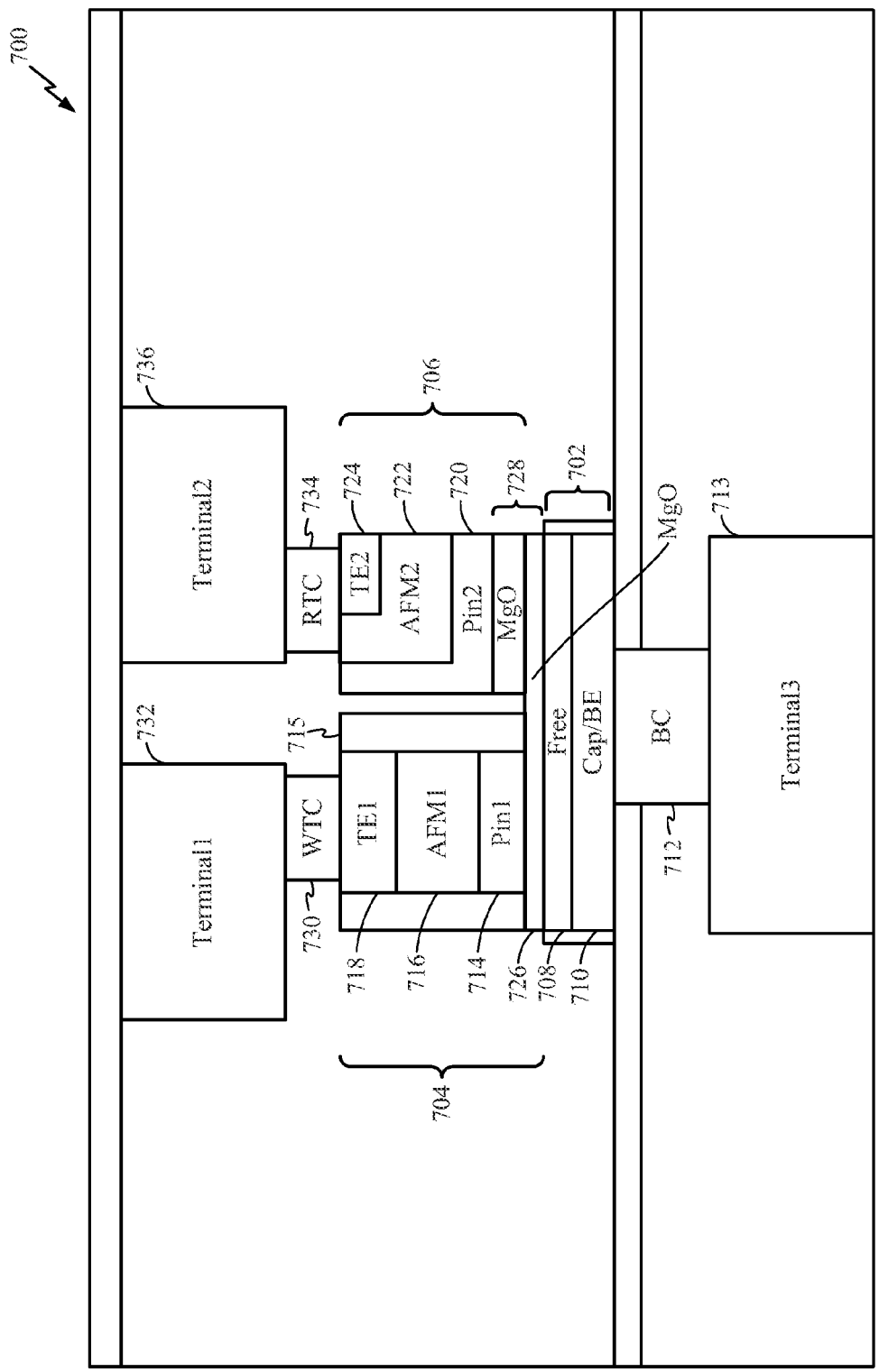
FIG. 7A-7B are cross-sectional diagrams of a three-port magnetic tunnel junction (MTJ) structure according to aspects of the present disclosure.

FIG. 7A is a cross-sectional diagram of an arrangement of layers of a representative three port magnetic tunnel junction (MTJ) structure 700 according to another aspect of the disclosure. The three port MTJ structure 700 includes a free layer structure 702 coupled to two pin layer structures 704, 706. The free layer structure 702 includes a free layer 708 and a cap layer 710 coupled to a bottom contact 712.

A first pin layer structure 704 includes a first pin layer 714 coupled to a first anti-ferromagnetic (AFM) layer 716. The first AFM layer 716 is coupled to a first top electrode layer 718. A second pin layer structure 706 includes a second pin layer 720 coupled to a second AFM layer 722. The second AFM layer 722 is coupled to a second top electrode layer 724.

A single barrier layer 726 is coupled between the free layer 708 and the first pin layer 714. A double barrier layer 728 is coupled between the free layer 704 and the second pin layer 720. A first top contact (write top contact (WTC)) 730 is coupled between the first top electrode 718 and a first terminal 732 of the three port MTJ structure 700. A second top contact (read top contact (RTC)) 734 is coupled between the second top electrode 724 and a second terminal 736 of the three port MTJ structure 700. The bottom contact 712 is coupled to a third terminal 713 of the three port MTJ structure 700.

According to one aspect of the present disclosure, a process of fabricating the three port MTJ 700 includes depositing a single barrier layer, for example a first MgO layer, on the free layer 708 then patterning the first pin layer structure 704. A passivation film 715 is deposited around the first pin layer structure 704. A second MgO layer is then deposited to form the thick barrier layer 728. The thick barrier layer 728 may include non-flat portions extending along the passivation film 715, for example. The second pin layer 720 and the second AFM layer 722 are deposited over the second MgO layer 728 to form the second pin layer structure 706. The resulting three port MTJ structure 700 may be configured and accessed in an array in the same way as the three port MTJ structures 302 shown in FIG. 3.

Figure 7B:
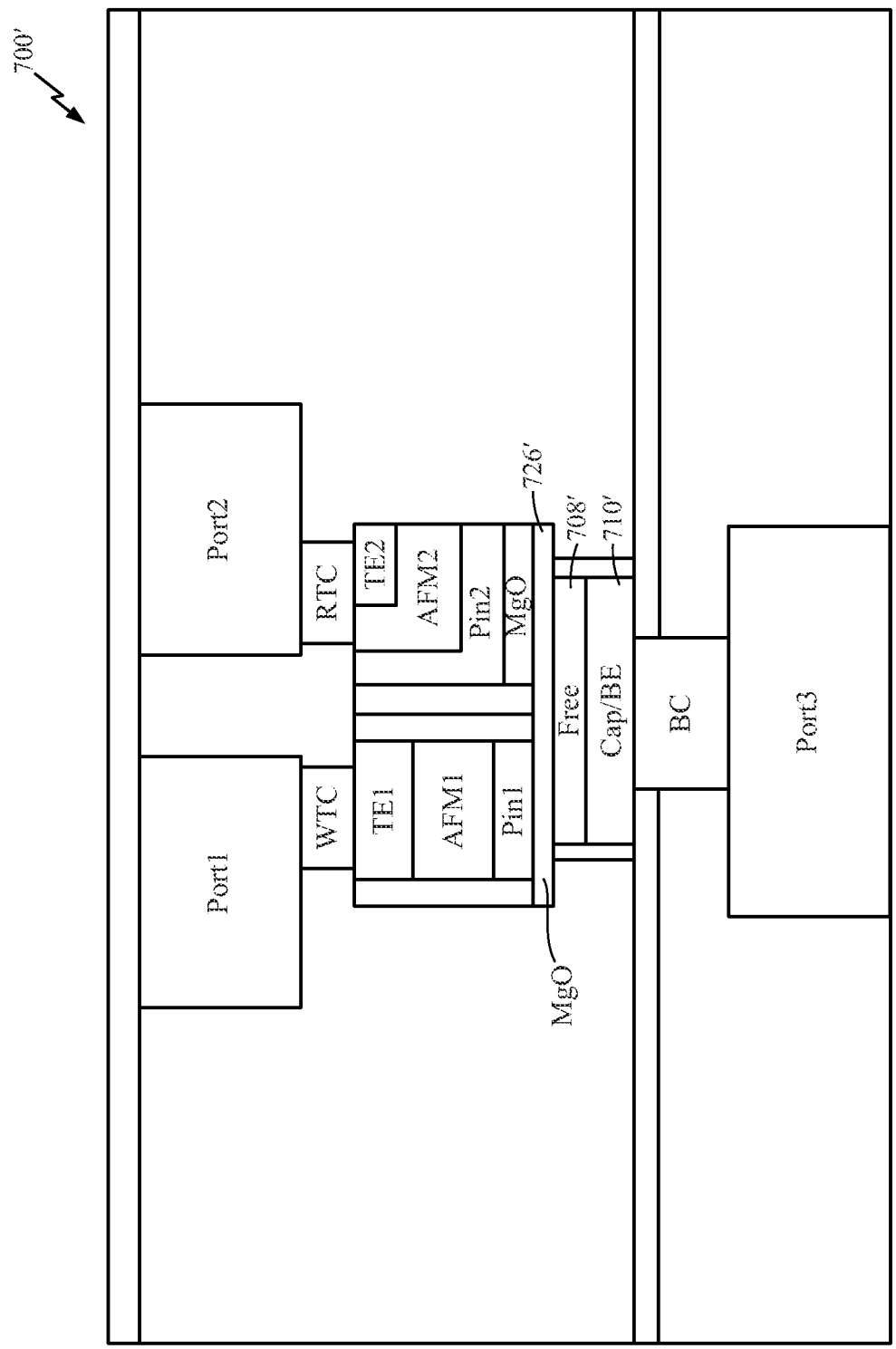

Although FIG. 7A shows free layer 708 and cap layer 710 extending substantially the same length as the single barrier layer 726, alternate configurations are also contemplated. For example, as seen in FIG. 7B the free layer 708' and cap layer 710' can be smaller than the single barrier layer 726' to help reduce write current.

Figure 8:
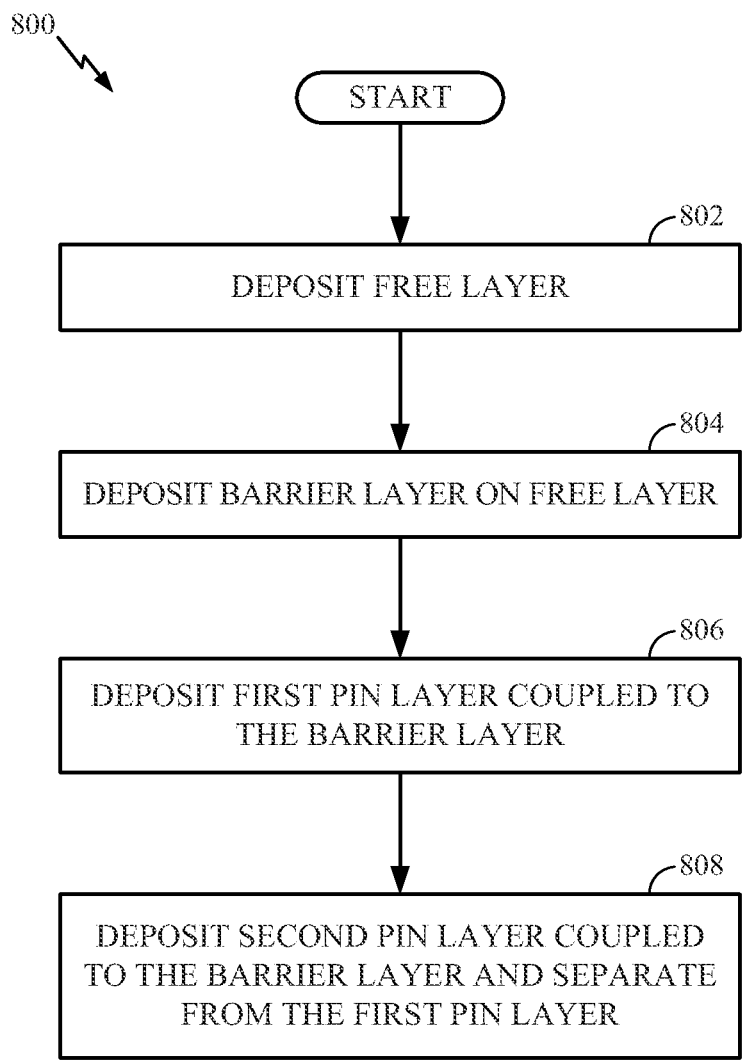
FIG. 8 is process flow diagram illustrating a method of increasing thermal stability in MRAM cells according to aspects of the present disclosure.

FIG. 8 is a process flow diagram illustrating a method of constructing a three port MTJ structure according to one aspect of the present disclosure. The method includes depositing a free layer in block 802 and depositing a barrier layer on the free layer in block 804. The method also includes depositing a first pin layer coupled to the barrier layer in block 806. In block 808, the method includes depositing a second pin layer coupled to the barrier layer and separate from the first pin layer.

Figure 9:
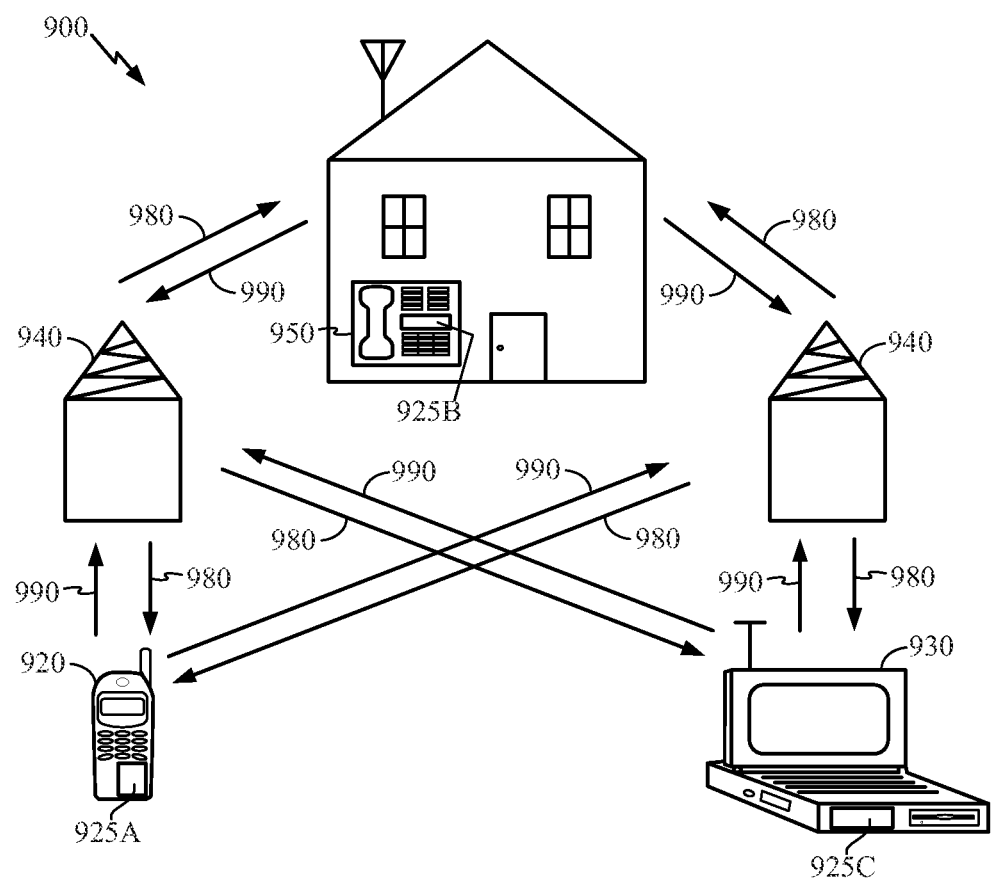
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B that include the disclosed MTJ. It will be recognized that other devices may also include the disclosed MTJ, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 9 illustrates remote units according to the teachings of the disclosure, the disclosure is not limited to these exemplary illustrated units. Aspects of the disclosure may be suitably employed in many devices which include MTJ.

Figure 10:
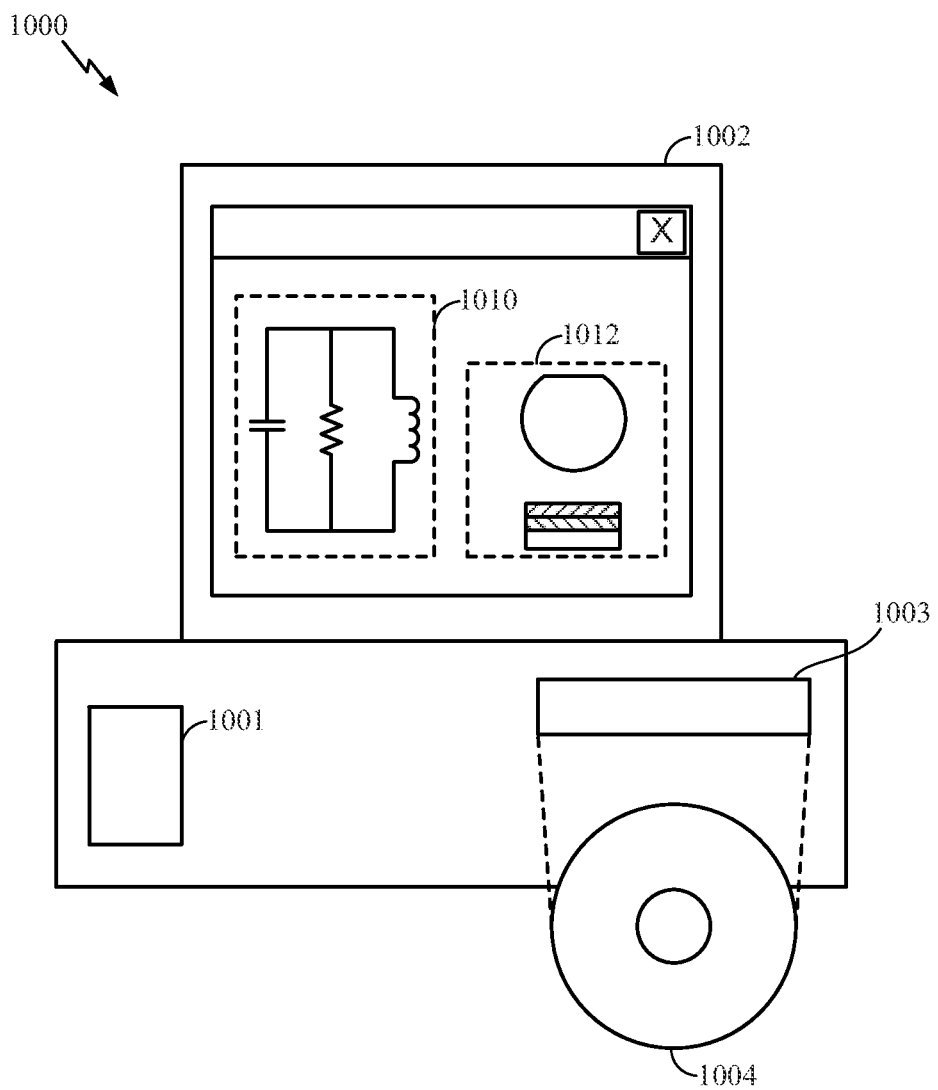
FIG. 10 is a block diagram illustrating a design workstation used for circuit, layout, and logic design of a semiconductor component according to one aspect.

FIG. 10 is a block diagram illustrating a design workstation used for circuit, layout, and logic design of a semiconductor component, such as the MTJ disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as an MTJ. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A three port magnetic tunnel junction (MTJ), comprising:
   a free layer;
   at least one barrier layer coupled to the free layer;
   a first pin layer deposited on a first portion of the at least one barrier layer; and
   a second pin layer deposited on a second portion of the at least one barrier layer and separate from the first pin layer, the first portion of the at least one barrier layer coupled to the second portion of the at least one barrier layer.

2. The three port magnetic tunnel junction (MTJ) of claim 1, in which the at least one barrier layer comprises:
   the first portion of the at least one barrier layer coupled to the first pin layer, and
   the second portion of the at least one barrier layer thicker than the first portion of the at least one barrier layer and coupled to the second pin layer.

3. The three port magnetic tunnel junction (MTJ) of claim 1, integrated in at least one of a mobile phone, a set top box, a music player, a video player, an entertainment unit, a navigation device, a computer, a hand-held personal communication systems (PCS) unit, a portable data unit, and a fixed location data unit.

4. A method of constructing a three port magnetic tunnel junction (MTJ), comprising:
   depositing a free layer;
   depositing at least one barrier layer coupled to the free layer;
   depositing a first pin layer on a first portion of the at least one barrier layer; and
   depositing a second pin layer on a second portion of the at least one barrier layer and separate from the first pin layer, the first portion of the at least one barrier layer coupled to the second portion of the at least one barrier layer.

5. The method of claim 4, comprising:
   depositing a first barrier layer onto the free layer;
   depositing a second barrier layer onto the first barrier layer to provide a thick barrier layer between the second pin layer and the free layer; and
   etching a portion of the second barrier layer to provide a thin barrier layer between the first pin layer and the free layer.

6. The method of claim 4, further comprising integrating the three port magnetic tunnel junction (MTJ) into at least one of a mobile phone, a set top box, a music player, a video player, an entertainment unit, a navigation device, a computer, a hand-held personal communication systems (PCS) unit, a portable data unit, and a fixed location data unit.

7. A three port magnetic tunnel junction (MTJ) comprising:
   a bottom electrode,
   a free layer deposited over the bottom electrode;
   a barrier layer deposited over the free layer;
   a first pin layer deposited over a first portion of the barrier layer; and a second pin layer deposited over a second portion of the barrier layer and separate from the first pin layer, the first portion of the barrier layer coupled to the second portion of the barrier layer.

8. The three port magnetic tunnel junction (MTJ) of claim 7, further comprising:
a first anti-ferromagnetic (AFM) layer deposited over the first pin layer; and
a second anti-ferromagnetic (AFM) layer deposited over the second pin layer.

9. The three port magnetic tunnel junction (MTJ) of claim 8, further comprising:
a first top electrode deposited over the first anti-ferromagnetic (AFM) layer; and
a second top electrode deposited over the second anti-ferromagnetic (AFM) layer.

10. The three port magnetic tunnel junction (MTJ) of claim 7, further comprising:
a first top electrode deposited over the first pin layer; and
a second top electrode deposited over the second pin layer.

11. The three port magnetic tunnel junction (MTJ) of claim 7, in which the first portion of the barrier layer is thinner than the second portion of the barrier layer.

12. The three port magnetic tunnel junction (MTJ) of claim 11 in which the second portion of the barrier layer includes a second barrier layer deposited over the free layer.

13. The three port magnetic tunnel junction (MTJ) of claim 12 further comprising:
a passivation film deposited around the first pin layer and a first top electrode;
the second barrier layer including non-flat portions extending along the passivation film.

14. The three port magnetic tunnel junction (MTJ) of claim 7, in which the first portion of the barrier layer has the same thickness as the second portion of the barrier layer.

15. The three port magnetic tunnel junction (MTJ) of claim 7, in which the free layer thickness is less than the barrier layer thickness.

16. The three port magnetic tunnel junction (MTJ) of claim 7, integrated in at least one of a mobile phone, a set top box, a music player, a video player, an entertainment unit, a navigation device, a computer, a hand-held personal communication systems (PCS) unit, a portable data unit, and a fixed location data unit.

17. A three port magnetic tunnel junction (MTJ), comprising:
a first bottom electrode,
a second bottom electrode separate from the first bottom electrode;
a first anti-ferromagnetic (AFM) layer deposited over the first bottom electrode;
a second anti-ferromagnetic (AFM) layer deposited over the second bottom electrode;
a first pin layer deposited over the first anti-ferromagnetic (AFM) layer;
a second pin layer deposited over the second anti-ferromagnetic (AFM) layer;
a barrier layer deposited over the first pin layer and over the second pin layer;
a free layer deposited over the barrier layer; and
top electrode deposited over the free layer.

18. The three port magnetic tunnel junction (MTJ) of claim 17, integrated in at least one of a mobile phone, a set top box, a music player, a video player, an entertainment unit, a navigation device, a computer, a hand-held personal communication systems (PCS) unit, a portable data unit, and a fixed location data unit.

19. A three port magnetic tunnel junction (MTJ) comprising:
a first bottom electrode,
a second bottom electrode separate from the first bottom electrode;
a first pin layer deposited over the first bottom electrode;
a second pin layer deposited over the second bottom electrode;
a barrier layer including a first portion deposited on the first pin layer and a second portion deposited on the second pin layer, the first portion of the barrier layer coupled to the second portion of the barrier layer;
a free layer deposited over the barrier layer; and
a top electrode deposited over the free layer.

20. The three port magnetic tunnel junction (MTJ) of claim 19, integrated in at least one of a mobile phone, a set top box, a music player, a video player, an entertainment, unit, a navigation device, a computer, a hand-held personal communication systems (PCS) unit, a portable data unit, and a fixed location data unit.

21. A three port magnetic tunnel junction (MTJ), comprising:
a free layer;
at least one barrier layer coupled to the free layer;
a first portion of the at least one barrier layer deposited on a first pin layer; and
a second portion of the at least one barrier layer deposited on a second pin layer separate from the first pin layer, the first portion of the at least one barrier layer coupled to the second portion of the at least one barrier layer.

22. The three port magnetic tunnel junction (MTJ) of claim 21, in which the at least one barrier layer comprises:
the first portion of the at least one barrier layer coupled to the first pin layer, and
the second portion of the at least one barrier layer thicker than the first portion of the at least one barrier layer and coupled to the second pin layer.

23. The three port magnetic tunnel junction (MTJ) of claim 21, integrated in at least one of a mobile phone, a set top box, a music player, a video player, an entertainment unit, a navigation device, a computer, a hand-held personal communication systems (PCS) unit, a portable data unit, and a fixed location data unit.

* * * * *